United States Patent
Miyake

(10) Patent No.: US 7,352,842 B2
(45) Date of Patent: Apr. 1, 2008

(54) X-RAY GENERATOR AND EXPOSURE APPARATUS HAVING THE SAME

(75) Inventor: Akira Miyake, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 224 days.

(21) Appl. No.: 11/293,284

(22) Filed: Dec. 1, 2005

(65) Prior Publication Data

US 2006/0138364 A1    Jun. 29, 2006

(30) Foreign Application Priority Data

Dec. 1, 2004    (JP) .............................. 2004-348036

(51) Int. Cl.
*G21K 5/00*    (2006.01)
(52) U.S. Cl. ..................................... 378/34; 250/492.2
(58) Field of Classification Search ................... 378/34, 378/35, 119; 250/504 R, 492.1, 492.2
See application file for complete search history.

(56) References Cited

U.S. PATENT DOCUMENTS 6,861,656 B2 *  3/2005  Murakami ............... 250/492.1
6,946,669 B2 *  9/2005  Kleinschmidt .......... 250/504 R
7,148,952 B2 * 12/2006  Eurlings et al. ............. 355/53

FOREIGN PATENT DOCUMENTS

JP    2003-282424    10/2003
JP    2004-226244    8/2004

* cited by examiner

*Primary Examiner*—Jurie Yun
(74) *Attorney, Agent, or Firm*—Morgan & Finnegan, LLP

(57) ABSTRACT

An X-ray generator introducing an X-ray to an illumination optical system includes plural plasma light sources, and a reflector, movably arranged among the plural light sources, for switching light sources and for reflecting the X-ray from one of the plural light sources to the illumination optical system, wherein an angle between a plane determined by an optical axis of the X-ray emitted from the reflector and a line that connects the plural light sources to the reflector, and a polarization plane on which an electric field vector oscillates is between 45° and 135°, the polarization plane maximizing a reflectance to the X-ray of the illumination optical system.

4 Claims, 11 Drawing Sheets

PRIOR ART

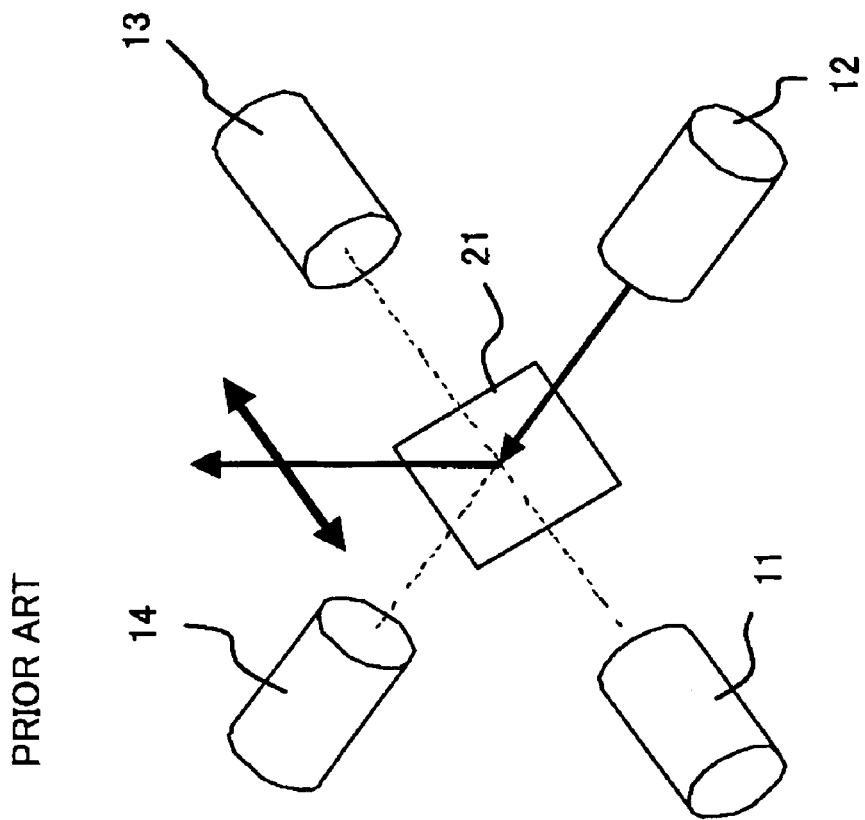
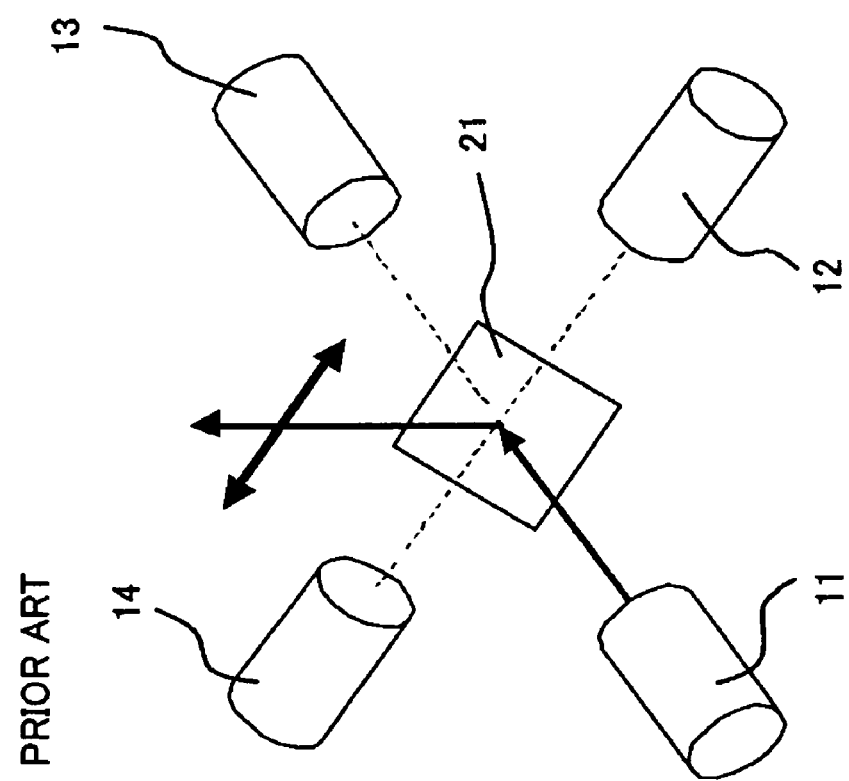

X-RAY GENERATOR AND EXPOSURE APPARATUS HAVING THE SAME

BACKGROUND OF THE INVENTION

The present invention relates to an X-ray generator that generates the X-ray and extreme ultraviolet ("EUV") light, and an exposure apparatus having the same.

In manufacturing such a fine semiconductor device as a semiconductor memory and a logic circuit in the photolithography technology, a reduction projection exposure apparatus has been conventionally employed which uses a projection optical system that projects a circuit pattern formed on a mask onto a wafer, etc. to transfer the circuit pattern.

The minimum critical dimension ("CD") to be transferred by the projection exposure apparatus or resolution is proportionate to a wavelength of light used for exposure. Thus, a projection optical apparatus using the EUV light with a wavelength of about 10 nm to about 15 nm much shorter than that of the UV light (referred to as "EUV exposure apparatus" hereinafter) has been developed. The EUV exposure apparatus uses a discharge type plasma light source that generates the plasma and generates the EUV light by introducing gas to the electrode for discharging. Such an EUV exposure apparatus is disclosed, for example, in Japanese Patent Publication, Application No. 2004-226244.

The EUV light source is used in a high vacuum similar to the mirror and mask. For example, the discharge type plasma light source generates the plasma by applying the high voltage to the electrode, and thus the electrode portion becomes at the high temperature. Although the cooling water chills the electrode, but the energy beyond the cooling capacity of the cooling water may need to be projected to continuously generate the high-intensity EUV light. However, the vacuum has no air around the electrode to radiate the heat, and the temperature of the electrode gradually rises and the continuous driving melts the electrode portion.

Measures that attempt to always maintain the light source in the normal temperature range and prevent damages of the electrode include a continuous emission method that decreases the applied voltage to the electrode and thus the EUV light intensity, and a method that introduces a downtime period and lowers the electrode temperature. However, both methods cause a drop of the throughput of the exposure apparatus. In order to expose without lowering the throughput, one disclosed method switches plural EUV light sources and cools the light source that is not being used for exposure. See, for example, Japanese Patent Publication, Application No. 2003-282424, which arranges four light sources 11 to 14 at intervals of 90°, as shown in FIGS. 9A and 9B, rotates a mirror 21, and introduces the EUV light to the subsequent illumination optical system.

The EUV exposure apparatus includes many mirrors, and each mirror's reflectance to the s-polarized light is higher than p-polarized light by several times. Since the p-polarized light is absorbed in the mirror and causes a generation of heat, effective use of the s-polarized light component of the incident light is vital to improve the use efficiency of the light. However, the prior art does not weigh the optimal polarization condition in switching the plural lights.

In other words, the prior art has a problem of fluctuation of the polarization plane, a surface on which the electric field vector oscillates, whenever the light source is switched. The fluctuation of the polarization plane becomes conspicuous when the light intensity is different between the s-polarized light and the p-polarized light reflected by the mirror 21. When the mirror 21 has a multilayer coating, the incident angle upon the mirror 21 (abscissa axis) and a ratio between the p-polarized light and the s-polarized light reflected by the mirror 21 (Rp/Rs) (ordinate axis) shows a characteristic shown in FIG. 2. It is understood from FIG. 2 that the p-polarized light component becomes 0 around 45°.

Since Japanese Patent Publication, Application No. 2003-282424 sets the incident angle upon the mirror 21 to about 45°, the reflected light on the mirror 21 becomes a linearly polarized light in which the electric field vector directs in the perpendicular direction to the optical axis of the light emitted from each light source. Therefore, whenever the light source is switched, the polarization plane rotates. For example, assume two planes shown in FIGS. 9A and 9B in Japanese Patent Publication, Application No. 2003-282424. The plane shown in FIG. 9A is a plane determined by the optical axis of the EUV light emitted form the mirror 21 and a line that connects the light source 11 to the mirror 21. The plane shown in FIG. 9B is a plane determined by the optical axis of the EUV light emitted form the mirror 21 and a line that connects the light source 12 to the mirror 21. When the mirror 21 switches the light source from 11 to 12 for, the plane rotates by 90° and the s-polarized light perpendicular to the plane rotates by 90°.

If the light emission state shown in FIG. 9A is set so as to provide the subsequent illumination optical system with the highest s-polarized light state, the emission state shown in FIG. 9B rotates by 90° and the use efficiency of the illumination optical system exhibits the lowest s-polarized light. As a result, the throughput drops in the emission state shown in FIG. 9B. When the mirror 21 is rotated at a predetermined pulse, the mask is illuminated with an oscillation of strong and weak intensities and thus the exposure dose fluctuates. As a result, some of plural patterns having the same CD are exposed, but other patterns are not.

BRIEF SUMMARY OF THE INVENTION

Accordingly, it is an exemplary object of the present invention to provide an X-ray generator and an exposure apparatus having the same, which use and switch plural light sources, and prevent a drop of reflectance of the subsequent optical system and a fluctuation of the exposure dose.

An X-ray generator according to one aspect of the present invention introducing an X-ray to an illumination optical system includes plural plasma light sources, and a reflector, movably arranged among the plural light sources, for switching light sources and for reflecting the X-ray from one of the plural light sources to the illumination optical system, wherein an angle between a plane determined by an optical axis of the X-ray emitted from the reflector and a line that connects the plural light sources to the reflector, and a polarization plane on which an electric field vector oscillates is between 45° and 135°, the polarization plane maximizing a reflectance to the X-ray of the illumination optical system.

An X-ray generator according to another aspect of the present invention for generating plasma and introducing an X-ray to a subsequent optical system includes plural light sources for generating the plasma; and a reflector, movably arranged among the plural light sources, for switching the plural light sources and for reflecting the X-ray to the optical system, wherein a plane determined by a line that connects the light sources to the reflector and an optical axis of the X-ray emitted from the reflector varies an angle having an absolute value of 45° or smaller whenever the plural light sources are switched.

An X-ray generator according to still another aspect of the present invention for generating plasma and introducing an X-ray to a subsequent optical system includes plural light sources for generating the plasma; and a reflector, movably arranged among the plural light sources, for switching the plural light sources and for reflecting the X-ray to the optical system, wherein an incident angle of the X-ray from each of the light sources upon the reflector has an absolute value between 0° and 30°.

An X-ray generator according to another aspect of the present invention for generating plasma and introducing an X-ray to a subsequent optical system includes plural light sources for generating the plasma; and a reflector, movably arranged among the plural light sources, for switching the plural light sources and for reflecting the X-ray to the optical system, wherein an angle of the X-ray from each of the light sources upon the reflector has an absolute value between 0° and 30°.

An exposure apparatus according to another aspect of the present invention includes the above X-ray generator, an illumination optical system for illuminating a pattern of a mask by using an X-ray, and a projection optical system for projecting the pattern of the mask onto an object to be exposed.

A device manufacturing method according to one aspect of the present invention includes the steps of exposing an object by using the above exposure apparatus, and developing the object that has been exposed.

Other objects and further features of the present invention will become readily apparent from the following description of the preferred embodiments with reference to the accompanying drawings.

BRIEF DESCRIPTION OF THE DRAWINGS

FIGS. 9A and 9B are schematic block diagrams of an arrangement of a light source section in a conventional exposure apparatus.

DETAILED DESCRIPTION OF THE PREFERRED EMBODIMENTS

Referring now to the accompanying drawings, a description will be given of an EUV exposure apparatus 100 of this embodiment. The exposure apparatus 100 is a projection exposure apparatus that exposes a circuit pattern of a mask 120 onto an object 140 using the EUV light with a wavelength of 13.4 nm as illumination light for exposure in a step-and-scan manner. Of course, the exposure apparatus 100 may use a step-and-repeat manner. This exposure apparatus is suitable for a lithography process less than submicron or quarter micron, and the present embodiment uses the step-and-scan exposure apparatus (also referred to as a "scanner") as an example. The "step-and-scan," as used herein, is an exposure method that exposes a mask pattern onto a wafer by continuously scanning the wafer relative to the mask, and by moving, after a shot of exposure, the wafer stepwise to the next exposure area to be shot. The "step-and-repeat" is another mode of exposure method that moves a wafer stepwise to an exposure area for the next shot every shot of cell projection onto the wafer.

Figure 1:
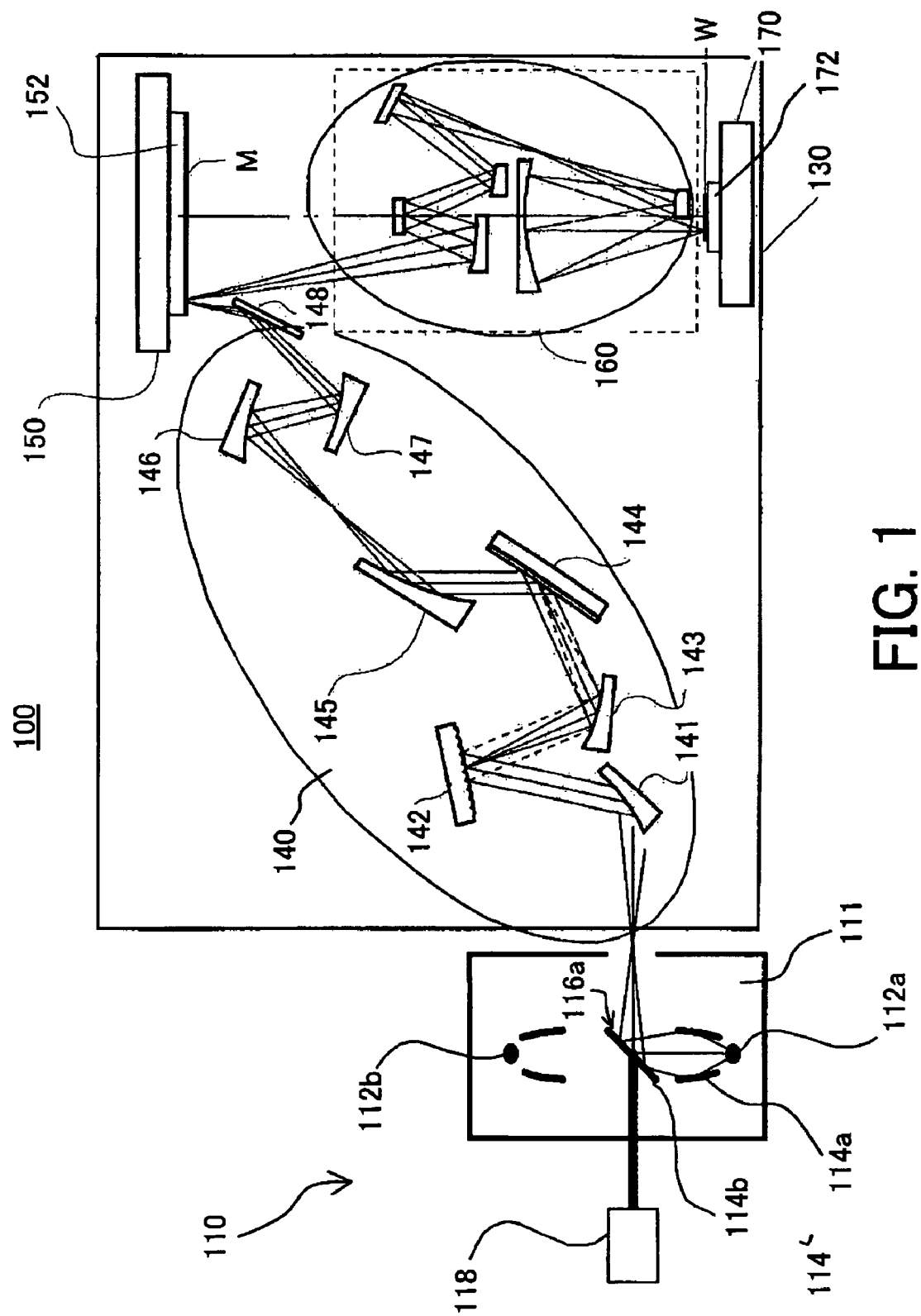
FIG. 1 is a schematic sectional view of an exposure apparatus according to a first embodiment of the present invention.

The exposure apparatus 100 includes a light source section 110, a vacuum chamber 130, an illumination optical system 140, a mask M, a mask stage 150, a mask chuck 152, a projection optical system 160, a wafer stage 170, and a wafer chuck 170. Here, FIG. 1 is a schematic sectional view of the exposure apparatus 100, and omits an alignment control mechanism for an alignment between the mask M and the wafer W, and a focus control mechanism for focusing of the wafer W.

The light source section 110 generates the EUV light, and includes a vacuum chamber 111, a pair of light sources 112a and 112b, a condenser mirror 114, a scan mirror 116, a scan mirror rotating mechanism 118.

The vacuum chamber 111 accommodates the pair of light sources 112a and 112b, the condenser mirror 114, the scan mirror 116, and part of the scan mirror rotating mechanism 118. In addition, the vacuum chamber 111 is maintained highly vacuum by an exhausting means (not shown) so as to prevent absorptions into the air and attenuations of the EUV light.

The light sources 112a and 112b are discharge type plasma light sources that generate the plasma and generates the X-ray by introducing gas to the electrode for discharging. In FIG. 1, the lines that connect each of the light sources 112a and 112b to the rotational center of the scan mirror 116 are aligned with each other. More specifically, the optical axes of the emitted lights from the light sources 112a and 112b intersect at one point, and the light sources 112a and 112b are arranged at regular intervals on the same circumference around the intersection of the optical axis. The scan mirror 116's rotational center is arranged at the intersection of the optical axis. However, this arrangement is not essential, and the line that connects the light source 112a to the scan mirror 116 may incline to the light that connects the light source 112b to the scan mirror 116.

The condenser mirror 114a is an elliptical mirror that condenses the EUV light from the light source 112a, and the condenser mirror 114b is an elliptical mirror that condenses the EUV light from the light source 112b. The condenser mirrors 114a and 114b have a first focal point at a plasma emission point, and a second focal point at a exit of the light source section 110. A light that connects the center of the plasma emission point and the center of the light source exit corresponds to the optical axis. The capturing solid angle depends upon a debris remover (not shown) and the illumination optical system 140.

The scan mirror 116 is rotatably arranged between the light sources 112a and 112b, and serves to deflect the EUV lights from the light sources 112a and 112b. The scan mirror 116 has a reflection surface 116a, which is arranged and inclined by 45° so that the EUV light reflected on the scan mirror directs in the same direction. When the rotating mechanism 118 rotates the scan mirror 116, the reflection surface 116a sequentially faces the light sources 112a and 112b. When each of the light sources 112a and 112b emits the EUV light, the EUV light is reflected on the scan mirror 116 and introduced to the light source exit. The rotating mechanism 118 can apply any rotating structure, such as use of a motor, known in the art, and a detailed description thereof will be omitted.

This embodiment sets to 90° an angle between a direction of the s-polarization plane of the illumination optical system 140 relative to the EUV light and a plane determined by the EUV light emitted from the scan mirror 116 and the line that connect the plural light sources 112a and 112b to the scan mirror 116. Nevertheless, the present invention allows the angle to be between 45° and 135° with respect to all of the plural light sources. Preferably, when the light sources are switched, the polarization plane of the light incident upon the illumination optical system maintains and thus the use efficiency of the light maintains maximum. This embodiment sets the number of plural light sources to two and the angle to 90°. However, a preferable angular range would be 90°±5°, when the manufacturing error etc. is weighed. Plural light sources are switched, and cooled when not in use. In order to maximize the effect of the present invention that arranges plural light sources and cools the non-used light source, the large number of light sources is preferable. Each light source has a condenser mirror. Even a close configuration causes a spread of an angle, and it is difficult to maintain the angle close to 90°. On the other hand, the angle between 45° and 135° maintains the efficiency of at least 70% or higher of that with the angle of 90° and consequently a sufficiently high use efficiency of the light. The condition of the angle between 45° and 135° corresponds to a change of an angle of the plane to 45° or smaller when the light sources are switched, if the plane is determined by the optical axis of the EUV light from the scan mirror 116 and the line that connects the plural light sources 112a and 112b to the scan mirror 116.

While this embodiment sets the incident angle upon the scan mirror 116 to 45°, the present invention does not limit the angle to 45°. For efficiently reflect the EUV light, the scan mirror 116 has a multilayer coating made of molybdenum and silicon having such an optimized coating cycle that the scan mirror 116's the reflectance of the EUV light having 13.5 nm becomes maximum. When the incident angle upon the multilayer mirror becomes about 45°, the reflectance drastically differs between the polarized light components of the light. The p-polarized light is the polarized light having an electric field vector within a plane that contains the optical axis of the incident light and is perpendicular to the reflecting surface. The s-polarized light is the polarized light that has an electric field vector orthogonal to that of the p-polarized light. At the incident angle upon the multilayer mirror of about 45°, the reflectance of the p-polarized light becomes minimum and the reflectance of the s-polarized light does not change drastically. Therefore, when the non-polarized light is incident upon the multilayer mirror at an angle of about 45°, the p-polarized light is hardly reflected and the reflected light includes almost the linearly polarized light or the s-polarized light. Here, "about 45°" covers a range between 30° and 60° for the following reasons.

Figure 2:
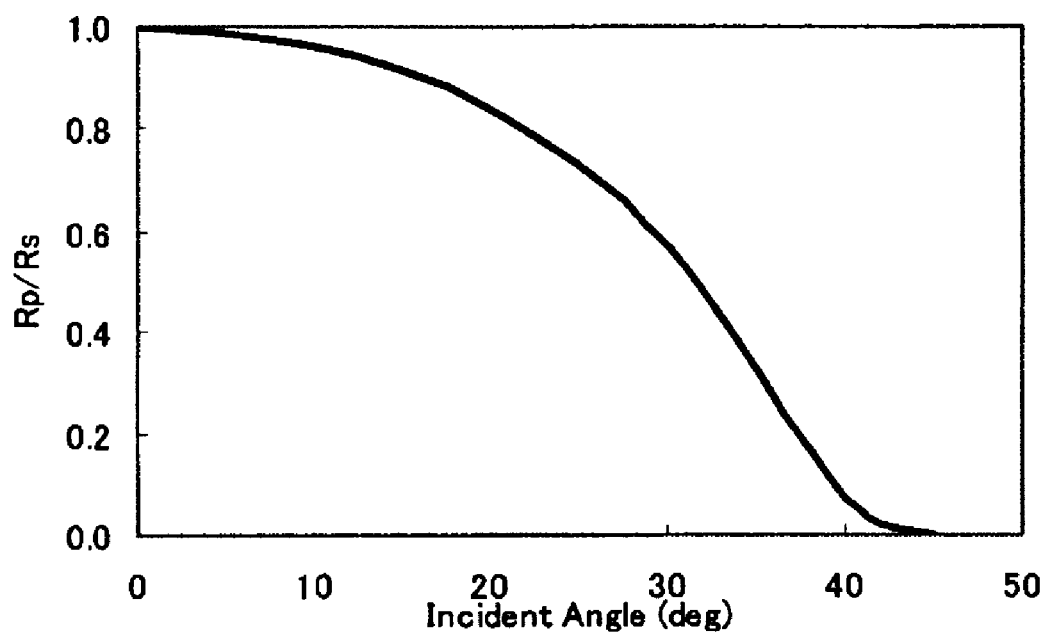
FIG. 2 is a graph showing an incident angle dependency of the reflectance of the multilayer mirror.

FIG. 2 shows a difference of polarization dependant reflectance of the multilayer mirror. The multilayer coating includes plural pairs of molybdenum and silicon, and the light has a wavelength about 13.5 nm. The cycle of the multilayer coating is optimized so that the reflectance can be maximum for each incident angle. A ratio Rp/Rs is plotted where Rs is the s-polarized light component's reflectance, and Rp is the p-polarized light component's reflectance. The reflectance of the p-polarized light component is smaller than that of the s-polarized light as the incident angle increases, although they have a small difference near the normal incidence area. It is understood that when the incident angle is close to 45°, the reflectance of the p-polarized light component becomes extremely small.

The illumination optical system 140 uses the arc-shaped EUV light, for example, with a wavelength of 13.5 nm corresponding to an arc-shaped field of the projection optical system 160 to illuminate the mask M, and includes condenser mirrors 141, 143-148, an optical integrator 142. The condenser mirror serves to collect the EUV light that is radiated from the light source exit. The optical integrator 142 serves to uniformly illuminate the mask M with a predetermined numerical aperture ("NA"). The illumination optical system 140 may use a multilayer mirror and a grazing angle total reflection mirror.

As shown in FIG. 1, reflection points of the principal rays of the components in the illumination optical system 140 are arranged on a single plane (or paper surface), and the principal rays advance along this plane in the illumination optical system 140. With respect to all the mirrors 141 to 148 in the illumination optical system 140, the electric field vector of the s-polarized component of the incident light is perpendicular to the plane. Thus, the polarized light component having an electric field vector perpendicular to the plane in the light incident upon the illumination optical system 140 is the s-polarized light condition for the mirrors 141 to 148 in the illumination optical system 140, enhancing the reflectance. On the other hand, the polarized light component having an electric field vector parallel to the plane is the p-polarized light condition for the mirrors 141 to 148 in the illumination optical system 140, decreasing the reflectance.

Since this embodiment arranges the center axes of the light sources 112a and 112b, the condenser mirrors 114a and 114b, and the scan mirror 116 on the above plane, the light reflected on the scan mirror 116 sets the s-polarized light to a polarized light whose electric field vector directs a direction perpendicular to the plane, enhancing the reflectance. This polarized light component also becomes the s-polarized light for the mirrors 141 to 148 in the illumination optical system 140, and maintains the high reflectance of the illumination optical system 140, enabling the mask M to be illuminated at a high efficiency. The high light intensity of the pattern image on the wafer W shortens a necessary exposure time period to expose the resist and improves the throughput of the exposure apparatus. The polarization plane of the s-polarized light accords between the scan mirror 116 and the illumination optical system 140, whichever light source 112a or 112b is used. Therefore, the throughput of the exposure apparatus 100 is always enhanced even when the scan mirror 116 switches the light source.

The scan mirror 116 selects one of the light sources, the selected on emits and illuminates the mask M, and the projection optical system 160 projects a reduced size of the pattern onto the wafer W. The mask M is a reflection mask that has a circuit pattern or image to be transferred, and supported and driven by the mask stage 152. The diffracted light from the mask M is reflected by the projection optical system 160 and projected onto the wafer W. The mask M and the wafer W are arranged in an optically conjugate relationship. The exposure apparatus 100 is a scanner, and projects the pattern of the mask M onto the wafer W by scanning the mask M and the wafer W.

The mask stage 150 supports the mask M and is connected to a moving mechanism (not shown). The mask stage 150 may use any structure known in the art. A moving mechanism (not shown) may include a linear motor etc., and drives the mask stage 150 at least in a direction X and moves the mask M. The exposure apparatus 100 synchronously scans the mask M and the wafer W.

The projection optical system 160 uses plural multilayer mirrors 130a to project a reduced size of a pattern of the mask M onto the wafer W on the image plane. The number of mirrors is about four to six. For wide exposure area with the small number of mirrors, the mask M and wafer W are simultaneously scanned to transfer a wide area that is an arc-shaped area or ring field apart from the optical axis by a predetermined distance. The projection optical system 160 has a NA of about 0.2 to 0.3.

The instant embodiment uses the wafer W as an object to be exposed, but the object to be exposed may include a spherical semiconductor and liquid crystal plate and a wide range of other objects to be exposed. Photoresist is applied onto the wafer W.

The wafer W is held onto the wafer stage 170 by a wafer chuck 172. The wafer stage 170 moves the wafer W, for example, using a linear motor in XYZ directions. The mask M and the wafer W are synchronously scanned. The positions of the mask stage 150 and wafer stage 170 are monitored, for example, by a laser interferometer, and driven at a constant speed ratio.

The alignment control mechanism measures a positional relationship between the position of the mask M and the optical axis of the projection optical system 160, and a positional relationship between the position of the wafer W and the optical axis of the projection optical system 160, and sets positions and angles of the mask stage 150 and the wafer stage 170 so that a projected image of the mask M may be positioned in place on the wafer W. A focus control mechanism measures a focus position on the wafer W surface, and control over a position and angle of the wafer stage 170 may always maintain the wafer W surface at an imaging position of the projection optical system 160 during exposure.

In exposure, the EUV light emitted from the light source section 110 illuminates the mask M via the illumination optical system 140, and images a pattern of the mask M onto the wafer W surface. The instant embodiment uses an arc or ring shaped image plane, scans the mask M and wafer W at a speed ratio corresponding to a reduction ratio to expose the entire surface of the mask M.

When a single scan exposure ends on the wafer W, the emission of the light source stops and the scan mirror 116 rotates to switch the light source to another light source. During this time period, the wafer stage 150 steps to the next scan exposure start position in the XY directions, and the switched light source starts emitting. As a result, the mask M and the wafer W are synchronously scanned for exposure. During this time period, the previously emitting light source suspends, and its electrodes are sufficiently cooled, and prevented from getting damages and worn.

The exposure that switches two light sources 112a and 112b avoids damages and exhaustion of the light source, and provides an emission with a high intensity. This configuration improves the throughput of the exposure apparatus 100, and prolongs the life of the light source, reducing the running cost. The reduced scattering of the light intensity between light sources prevents a fluctuation of the resolving power, and realizes the high-quality exposure. Therefore, the exposure apparatus stably generates the EUV light, and provides devices, such as a semiconductor device, an LCD device, an imaging device (e.g., a CCD), and a thin-film magnetic head, with high throughput and economical efficiency.

Figure 3:
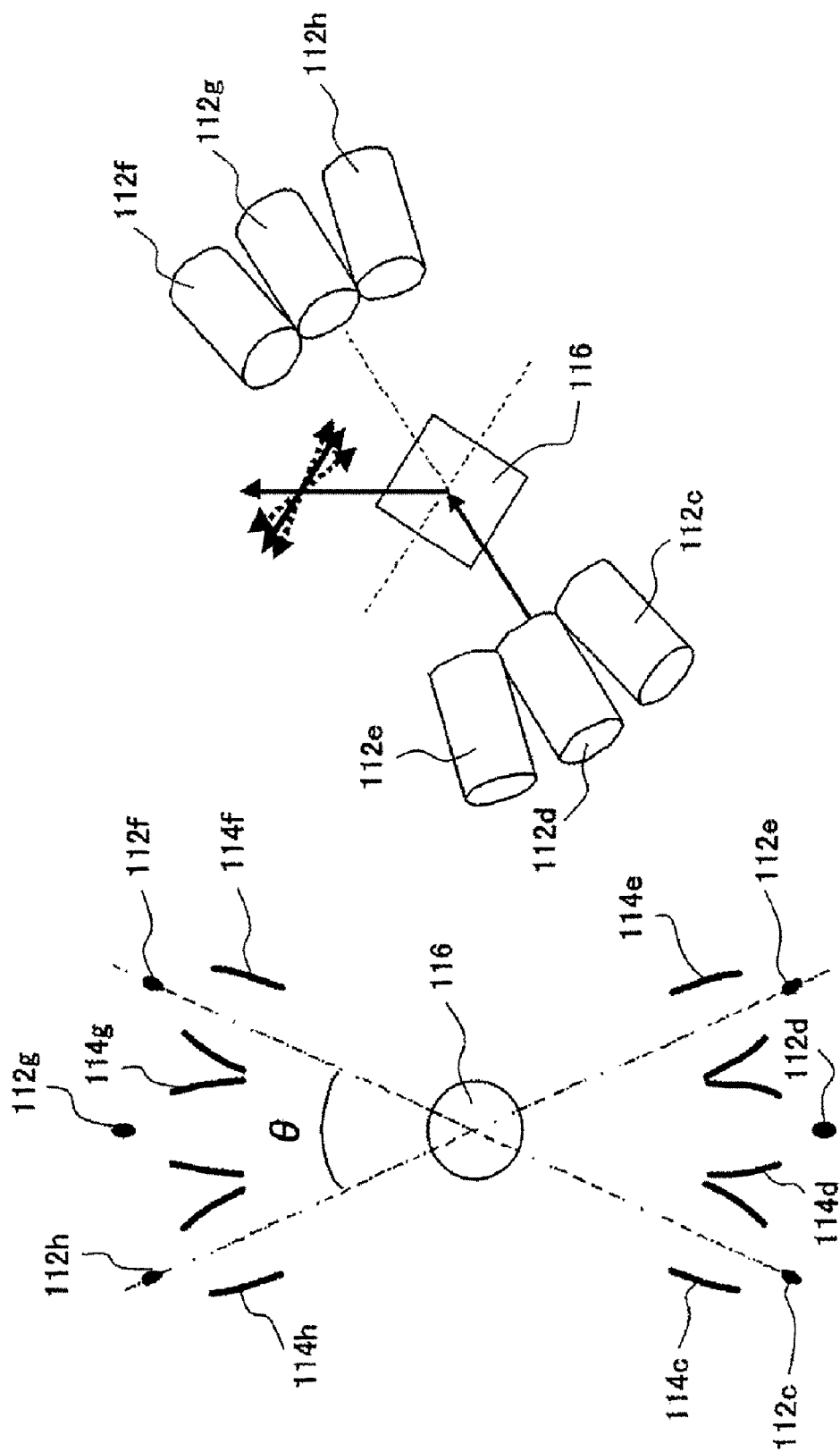
FIGS. 3A and 3B are schematic sectional and perspective views showing a variation of a light source section of the exposure apparatus shown in FIG. 1.

The number of light sources is not limited to two. FIG. 3A is a schematic sectional view of an embodiment that uses six light sources 112c to 112h, and FIG. 3B is its schematic perspective view, although FIG. 3B omits the condenser mirrors 114c to 114h for convenience. An angle $\theta$ between the above plane and a light that connects each light source to the scan mirror 116 is set within a small angular range, such as 45° or smaller, preferably 30° or smaller. This embodiment changes by $\theta$ the polarization plane of the light emitted when the light sources are switched. If the incident angle upon the scan mirror 116 is 45°, the reflectance to the p-polarized light becomes approximately 0 and the light incident upon the illumination optical system becomes approximately a linearly polarized light. When the direction of the electric field of the incident light does not become perpendicular to the plane and shifts by an angle $\theta$ relative to the right angle, the maximum efficiency loss reaches $(1-\cos\theta)$ in comparison with the normal incidence case. The loss is about 30% at $\theta$ of 45°; the efficiency loss decreases for small $\theta$.

Since the light source and the condenser mirror have finite sizes, it is difficult to extremely reduce $\theta$ when plural light sources are arranged. Three or more light sources can be arranged without a large efficiency loss, if $\theta$ is 45° or smaller, preferably 30° or smaller. In this case, the driving frequency of each light source is lower, and accordingly a longer cooling time period can be maintained than a case where two light sources are switched. Therefore, this configuration can avoid damages and exhaustion of the light source, provides an emission at a higher intensity, and improves the throughput of the exposure apparatus 100.

Figure 4:
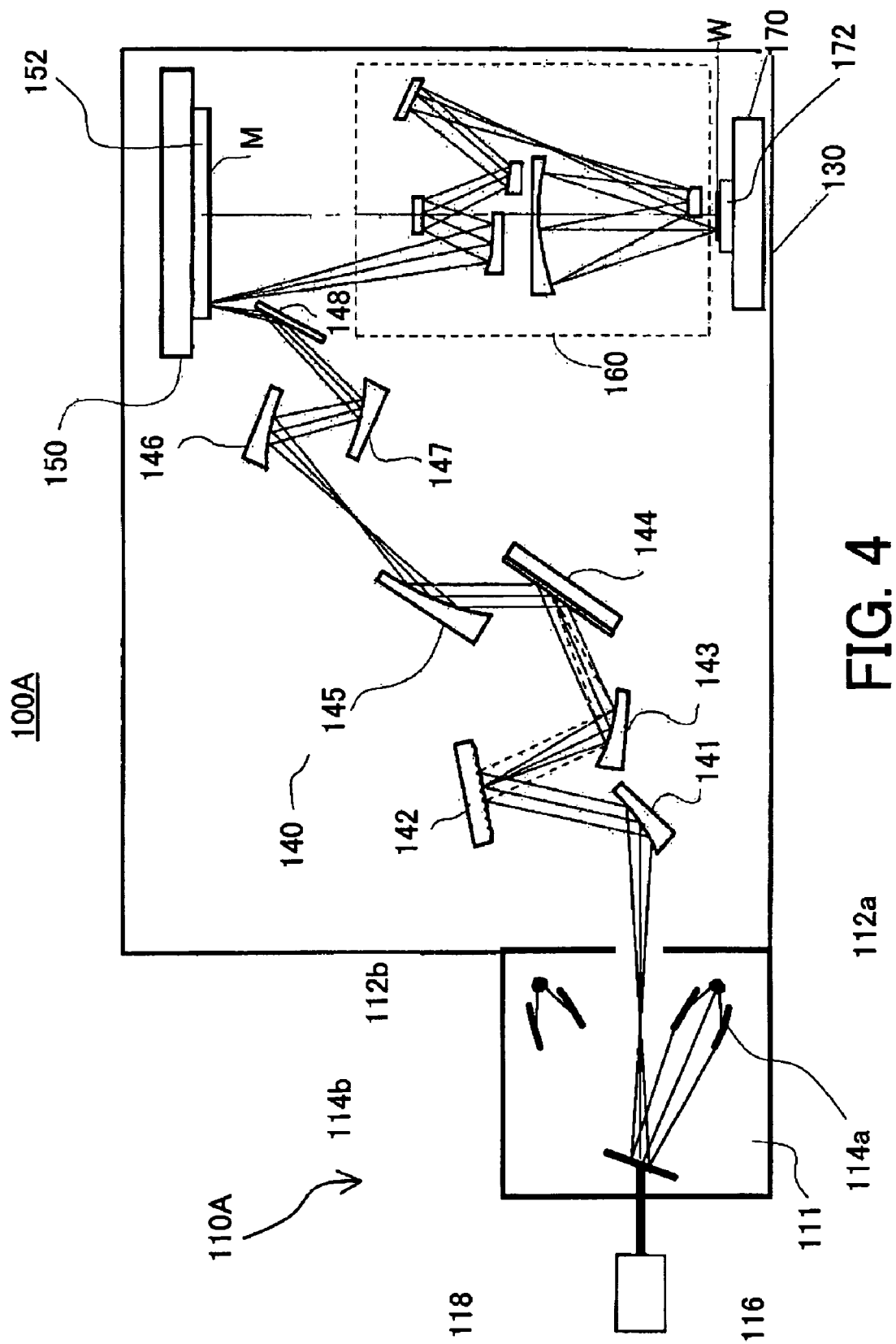
FIG. 4 is a schematic sectional view of an exposure apparatus according to a second embodiment of the present invention.

FIG. 4 shows an exposure apparatus 100A according to another embodiment. Those elements in FIG. 4, which are corresponding elements in FIG. 1, are designated by the same reference numerals, and a description thereof will be omitted. The exposure apparatus 100A is different from the exposure apparatus 100 in having a light source section 110A.

This embodiment sets an incident angle upon the scan mirror 116 to 10°. The scan mirror 116 has a multilayer coating made of molybdenum and silicon having such an optimized coating cycle that the reflectance to the EUV light having a wavelength of 13.5 nm can be maximum at this set incident angle.

As shown in FIG. 2, with respect to the reflectance of the multilayer mirror, there is little difference between the p-polarized light component and the s-polarized light component around the incident angle of 0° or in the normal incidence area. However, as the incident angle increases, the reflectance of the p-polarized light component becomes smaller than that of the s-polarized light component. Around the incident angle of 30°, the reflectance of the p-polarized light component is about 60% of that of the s-polarized light component. Since this embodiment sets the incident angle to 10°, the reflectance of the p-polarized light component is 96% of that of the s-polarized light component and there is little difference between them. Hence, the polarization state of the light that is reflected on the scan mirror 116 and introduced to the illumination optical system 140 is almost the same non-polarization state as that emitted from the light source.

As a consequence, the polarization state of the light incident upon the illumination optical system 140 hardly varies even when the light sources are switched. The illumination optical system 140 maintains a high reflectance, and illuminates the mask M at a high efficiency. The high light intensity of the pattern image on the wafer W shortens a necessary exposure time period, and improves the throughput of the exposure apparatus 100A.

While this embodiment illustratively sets the incident angle upon the scan mirror 116 to 10°, the present invention does not limit the incident angle to 10°. The incident angle up to 30° does not increase a difference of reflectance between the p-polarized light and the s-polarized light, and provides the effect of the present invention. The present invention does not require the incident angles from the light sources 112a and 112b upon the scan mirror 116 to be the same, and the light sources 112a and 112b may be arranged within a certain incident angle range. For example, assume that the light sources 112a and 112b are positioned differently so that Rp/Rs of the light source 112a is about 1.0 and Rp/Rs of the light source 112b is about 0.6. When these light sources are switched, the EUV light having an intensity pulse between 1.0 and 0.6 is generated. The incident angle of 30° or smaller leads to Rp/Rs of 0.6 or greater as in this embodiment, and is practical so as to improve the throughput and a fluctuation of the resolving power within a non-influential range.

The increased incident angle up to 30° enables plural light sources to be arranged without a large efficiency loss. The driving frequency of each light source is lower, and accordingly a longer cooling time period can be maintained than a case where a small number of light sources are switched. Therefore, this configuration can avoid damages and exhaustion of the light source, provides an emission at a higher intensity, and improves the throughput of the exposure apparatus.

Figure 5:
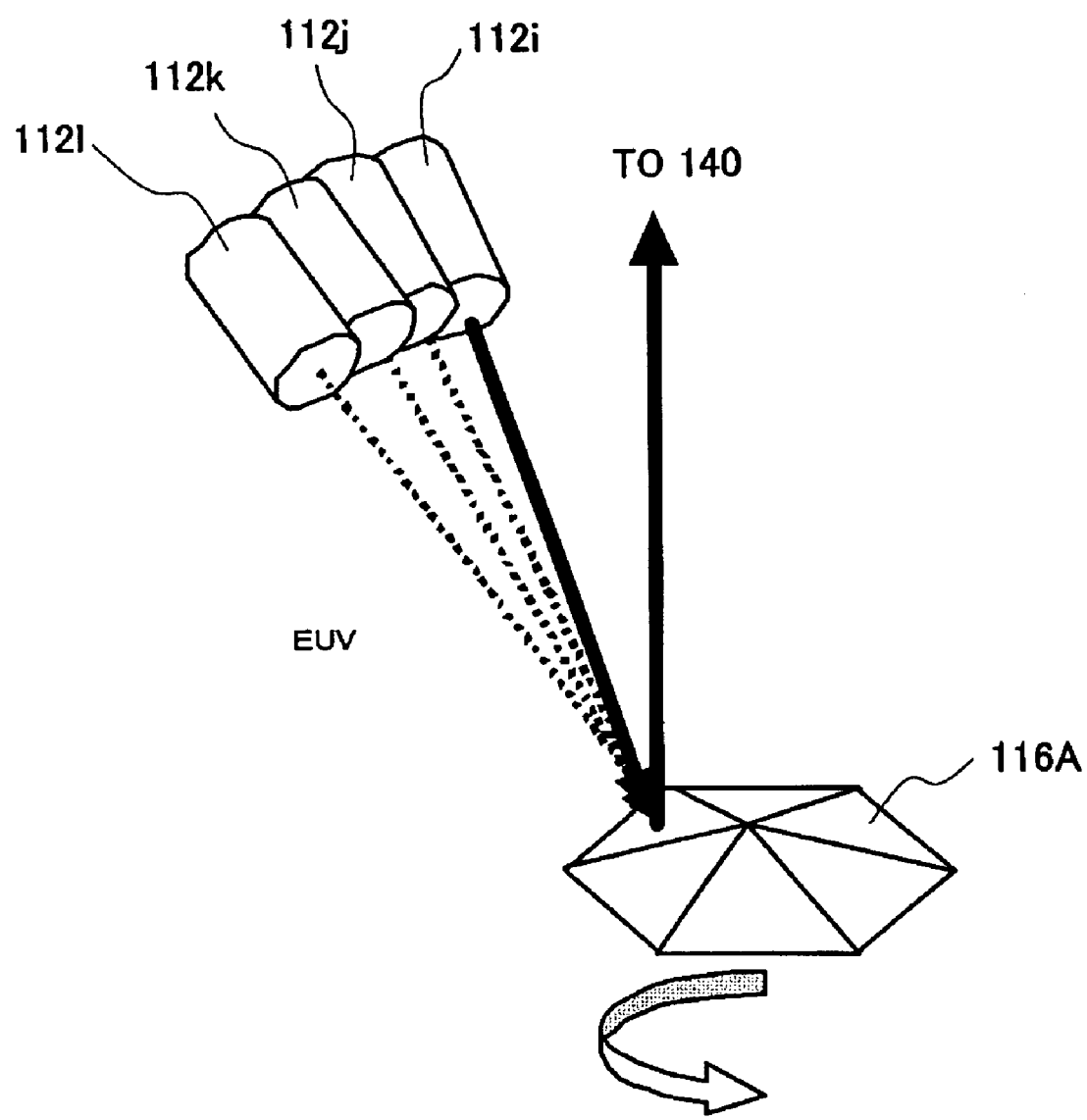
FIG. 5 is a schematic sectional and perspective view showing a variation of a light source section of an exposure apparatus shown in FIG. 4.

The scan mirror 116 may use a polygon mirror 116A shown in FIG. 5. This configuration is advantageous in that a slight angular change of the scan mirror 116A can switch the light sources 112i to 112l at a high speed. FIG. 5 omits the condenser mirror for convenience.

Figure 6:
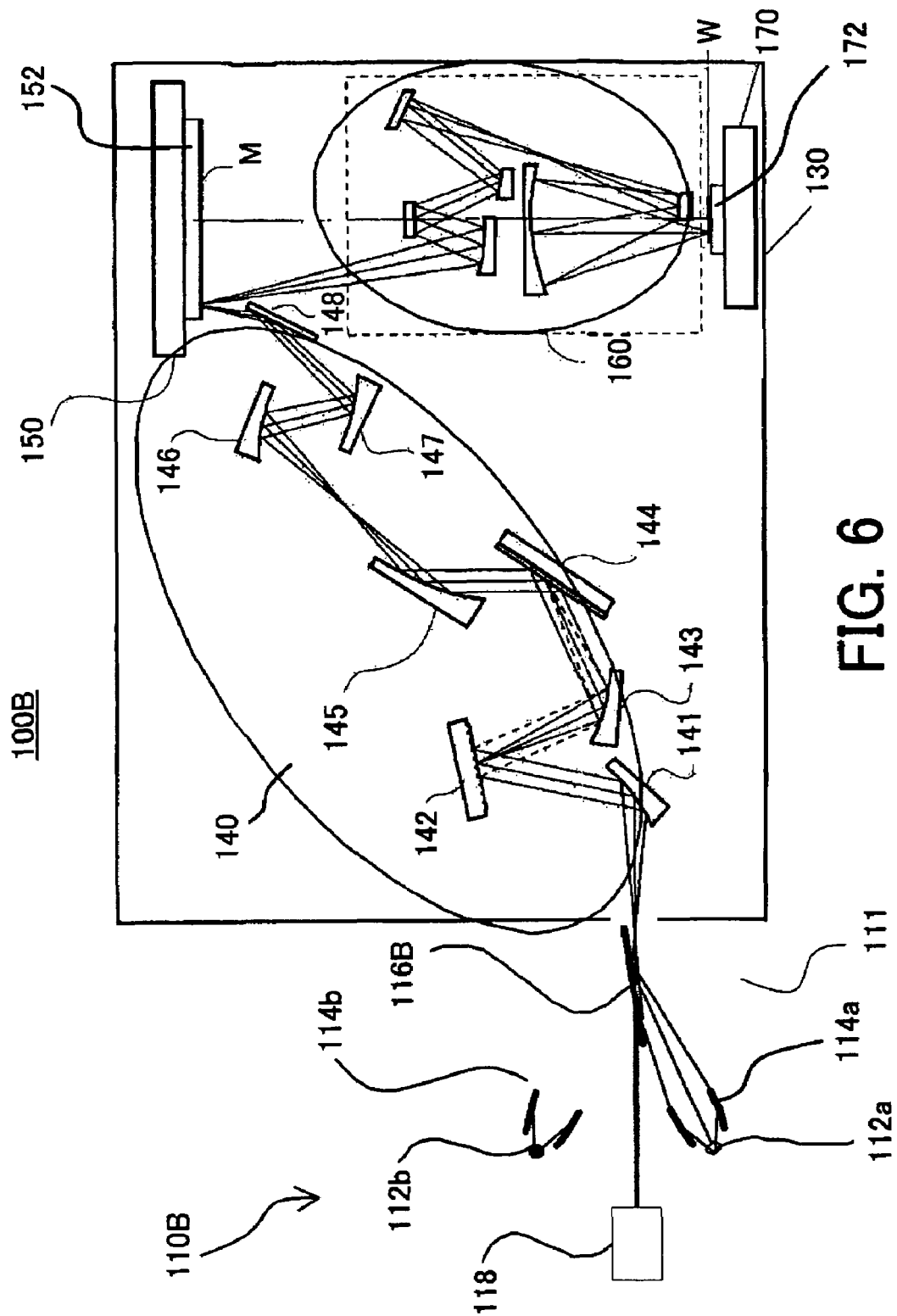
FIG. 6 is a schematic sectional view of an exposure apparatus according to a third embodiment of the present invention.

FIG. 6 shows an exposure apparatus 100B according to another embodiment. Those elements in FIG. 6, which are corresponding elements in FIG. 1, are designated by the same reference numerals, and a description thereof will be omitted. The exposure apparatus 100B is different from the exposure apparatus 100 in having a light source section 110B.

This embodiment sets an incident angle upon a scan mirror 116B to 80°. The scan mirror 116B has such a thin film that the EUV light having a wavelength of 13.5 nm generates a total reflection and enhances the reflectance at this set incident angle. The thin film is made of molybdenum, palladium, ruthenium, rhodium, carbon, etc. The scan mirror 116B is connected to a rotating mechanism 118, and a rotation of the scan mirror 116B can switch a pair of the light source and condenser mirror.

As shown in FIG. 6, with respect to the reflectance of the total reflection mirror, there is little difference between the p-polarized light component and the s-polarized light component around the incident angle of 90° or in the grazing angle or oblique incidence area. However, as the incident angle increases, the reflectance of the p-polarized light component becomes smaller than that of the s-polarized light component. When the incident angle is smaller than a critical angle, both the reflectances of the p-polarized and s-polarized lights lower. A difference of the reflectance is small due to the difference of polarized light when the incident angle is greater than the critical angle at which the reflectance abruptly changes. Since this embodiment sets the incident angle to 80°, the reflectance of the p-polarized light component is 90% of that of the s-polarized light component and there is little difference between them. Therefore, the polarization state of the light that is reflected on the scan mirror 116 and introduced to the illumination optical system 140 is almost the same non-polarization state as that emitted from the light source.

As a consequence, the polarization state of the light incident upon the illumination optical system 140 hardly changes even when the scan mirror 116B switches the light source. The illumination optical system 140 maintains a high reflectance, and illuminates the mask M at a high efficiency. The high light intensity of the pattern image on the wafer W shortens a necessary exposure time period, and improves the throughput of the exposure apparatus 100B.

Figure 8:
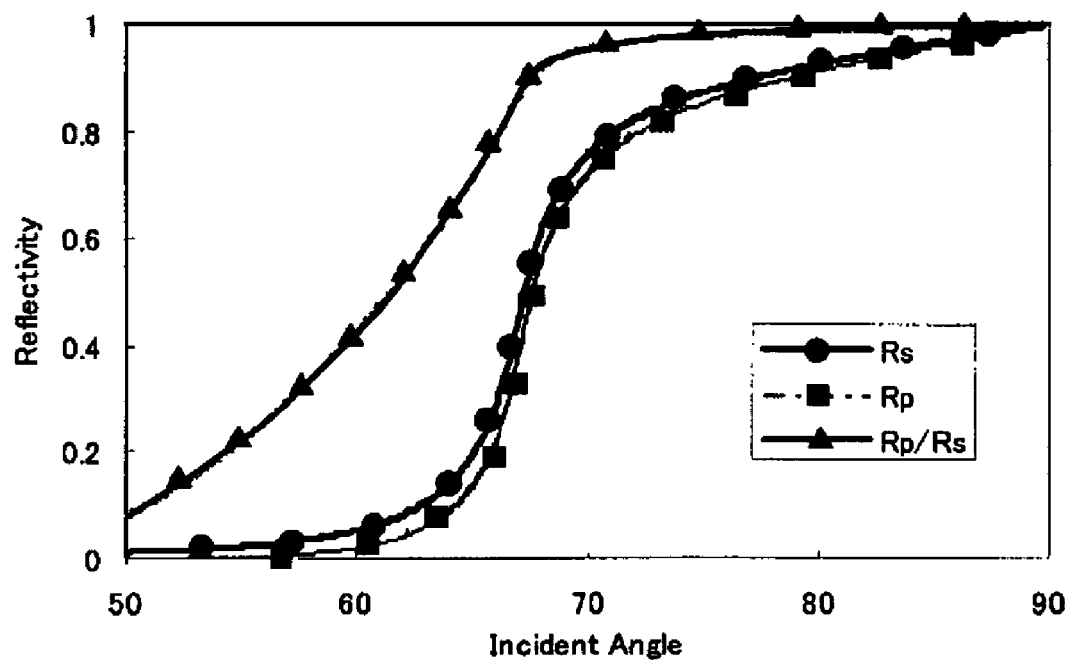
FIG. 8 is a graph showing an incident angle dependency of the reflectance of a grazing angle total reflection mirror.

While this embodiment illustratively sets the incident angle upon the scan mirror 116 to 80°, the present invention does not limit the incident angle to 80°. The incident angle 60° or greater does not increase a difference of reflectance between the p-polarized light and the s-polarized light, and provides the effect of the present invention. The reduced incident angle above 60° enables plural light sources to be arranged without a large efficiency loss. The driving frequency of each light source is lower, and accordingly a longer cooling time period can be maintained than a case where a small number of light sources are switched. This configuration can avoid damages and exhaustion of the light source, provides an emission at a higher intensity, and improves the throughput of the exposure apparatus. Setting of 60° is derived from FIG. 8 that provides a condition of Rp/Rs of about 0.6, and has a similar purport to aforementioned 30°.

Figure 7:
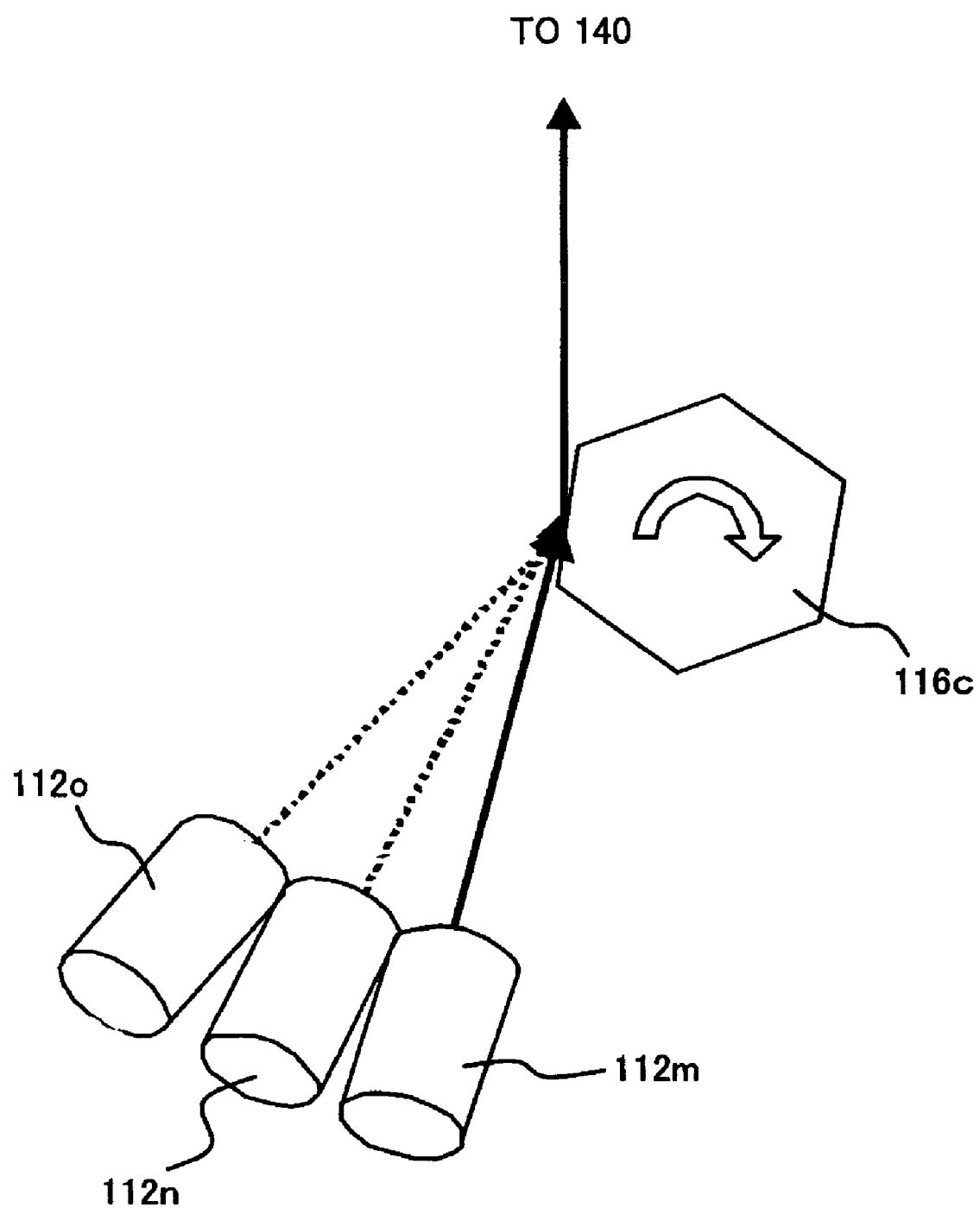
FIG. 7 is a schematic sectional and perspective view showing a variation of a light source section of an exposure apparatus shown in FIG. 6.

The scan mirror may use a polygon mirror 116C shown in FIG. 7. This configuration is advantageous in that a slight angular change of the scan mirror 116C can switch the light sources 112m to 112o at a high speed. FIG. 7 omits the condenser mirror for convenience.

Figure 10:
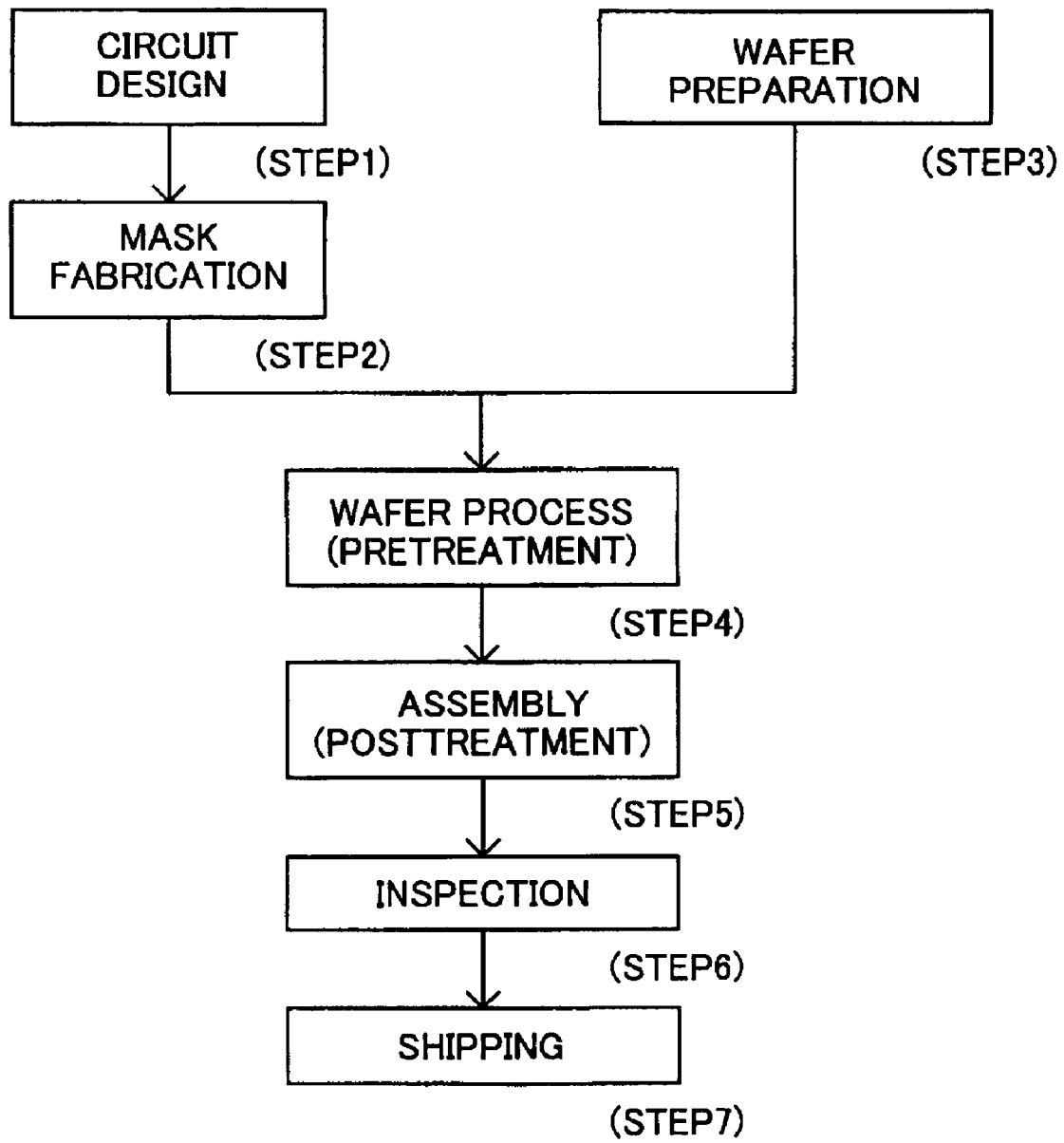
FIG. 10 is a flowchart for explaining manufacture of devices (such as semiconductor chips such as ICs and LCDs, CCDs, and the like).
Figure 11:
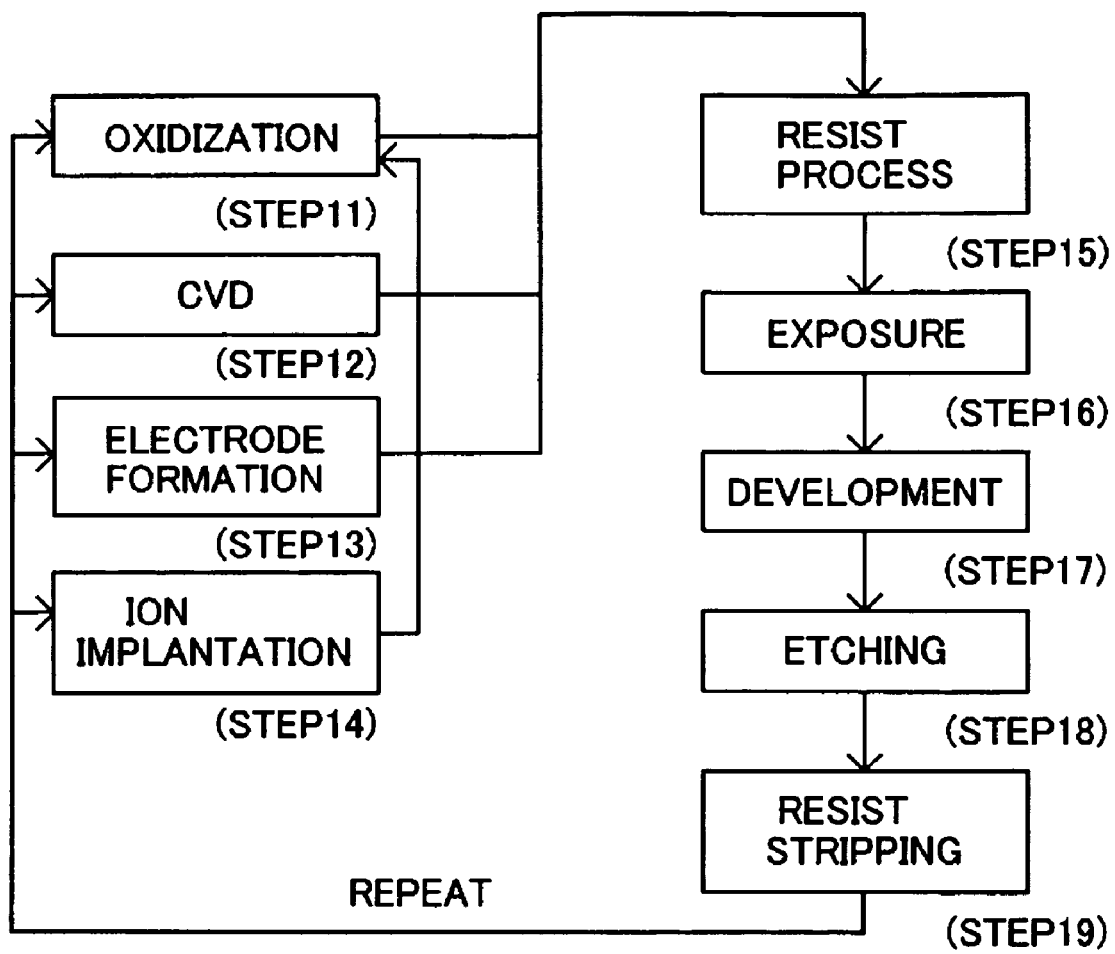
FIG. 11 is a detail flowchart of a wafer process as Step 4 shown in FIG. 10.

Referring now to FIGS. 10 and 11, a description will be given of an embodiment of a device manufacturing method using the above exposure apparatus 100. FIG. 10 is a flowchart for explaining manufacture of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 11 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern of the mask onto the wafer. Step 17 (development) develops the exposed wafer. Step 18 (etching) etches parts other than a developed resist image. Step 19 (resist stripping) removes the disused resist after etching. These steps are repeated, and multilayer circuit patterns are formed on the wafer. The device manufacturing method of this embodiment may manufacture a higher quality device than the conventional method. The device fabrication method that uses the exposure apparatus 100 and the resultant devices also constitute one aspect of the present invention.

Further, the present invention is not limited to these preferred embodiments, and various variations and modifications may be made without departing from the scope of the present invention.

This application claims a foreign priority benefit based on Japanese Patent Application No. 2004-348036, filed on Dec. 1, 2004, which is hereby incorporated by reference herein in its entirety as if fully set forth herein.

What is claimed is:

1. An exposure apparatus comprising:
   an illumination optical system for illuminating a pattern of a mask, said illumination optical system including plural mirrors, and reflection points of the principal rays on the mirrors being arranged on a single plane;
   a projection optical system for projecting the pattern of the mask onto an object to be exposed; and
   an X-ray generator and introducing an X-ray to said illumination optical system, said X-ray generator comprising:
   a pair of plasma light sources having optical axes that form a single line; and
   a reflector, rotatably arranged between said pair of plasma light sources, for switching light sources and for reflecting the X-ray from one of said pair of plasma light sources to said illumination optical system, said reflector's rotational center being located on the line and equally distant from said pair of plasma light sources,
   wherein said pair of plasma light sources are the only plasma light sources in said X-ray generator, and
   wherein said pair of plasma light sources and said reflector are arranged so that an electric field vector of a polarized light component perpendicular to a plane that contains each optical axis of said pair of plasma light sources and a normal of a reflecting surface of said reflector corresponding to each optical axis can be perpendicular to a plane that contains reflection points of principal rays on the mirrors in said illumination optical system.

2. An exposure apparatus according to claim 1, wherein the X-ray has a wavelength of 20 nm.

3. An exposure apparatus according to claim 1, wherein each of said pair of plasma light sources generates the plasma by flowing gas through electrodes and discharging between the electrodes.

4. A device manufacturing method comprising the steps of:
   exposing an object by using an exposure apparatus according to claim 1; and
   developing the object that has been exposed.

* * * * *